United States Patent [19]
Lai et al.

[11] Patent Number: 5,642,273
[45] Date of Patent: Jun. 24, 1997

[54] RESONANT SNUBBER INVERTER

[75] Inventors: Jih-Sheng Lai, Knoxville; Robert W. Young, Sr., Oak Ridge; Daoshen Chen, Knoxville; Matthew B. Scudiere, Oak Ridge; George W. Ott, Jr.; Clifford P. White, both of Knoxville; John W. McKeever, Oak Ridge, all of Tenn.

[73] Assignee: Martin Marietta Energy Systems, Inc., Oak Ridge, Tenn.

[21] Appl. No.: 316,612

[22] Filed: Sep. 30, 1994

[51] Int. Cl.$^6$ .................................................. H02H 7/122
[52] U.S. Cl. .............................. 363/56; 363/98; 363/132
[58] Field of Search .............................. 363/16, 55, 56, 363/97, 98, 131, 132; 323/222

[56] References Cited

U.S. PATENT DOCUMENTS

| | | | |
|---|---|---|---|
| 5,410,467 | 4/1995 | Smith et al. | 363/131 |
| 5,461,302 | 10/1995 | Garcia et al. | 323/222 |
| 5,477,131 | 12/1995 | Gegner | 323/222 |
| 5,486,752 | 1/1996 | Hua et al. | 363/16 |

OTHER PUBLICATIONS

"The Resonant DC Link Converter—A New Concept in Static Power Conversion," by D. M. Divan, Department of Electrical and Computer Engineering, University of Wisconsin, CH2272–3/86/0000–0648, ©1986 IEEE.

"A Rugged Soft Commutated PWM Inverter for AC Drives," by Ahmed Cheriti, et al, IEEE Log No. 9107102, 0885–8993 © IEEE, 1992.

"Resonant Snubbers with Auxiliary Switches," by William McMurray, Fellow, IEEE, IEEE Log No. 9207141, 0093–9994 ©1993 IEEE.

Primary Examiner—Peter S. Wong
Assistant Examiner—Y. J. Han
Attorney, Agent, or Firm—Andrew S. Neely

[57] ABSTRACT

A resonant, snubber-based, soft switching, inverter circuit achieves lossless switching during dc-to-ac power conversion and power conditioning with minimum component count and size. Current is supplied to the resonant snubber branches solely by the main inverter switches. Component count and size are reduced by use of a single semiconductor switch in the resonant snubber branches. Component count is also reduced by maximizing the use of stray capacitances of the main switches as parallel resonant capacitors. Resonance charging and discharging of the parallel capacitances allows lossless, zero voltage switching. In one embodiment, circuit component size and count are minimized while achieving lossless, zero voltage switching within a three-phase inverter.

12 Claims, 10 Drawing Sheets

Fig. 1

PRIOR ART

RESONANT SNUBBER INVERTER

This invention was made with Government support under Contract DE-AC05-84OR21400 awarded by the U.S. Department of Energy to Martin Marietta Energy Systems Inc., the Government has certain rights to this invention.

TECHNICAL FIELD

The present invention is directed to a resonant snubber based soft switching inverter circuit for achieving lossless switching of circuit components during dc-to-ac power conversion and power conditioning.

BACKGROUND

Switching losses during dc-to-ac power conversion in conventional inverters are highly undesirable. Switching losses can occur for a variety of reasons, including simultaneous voltage across the switch and current through the switch during turn-on. Switching losses may also occur as a result of reverse recovery current of a diode opposite the switch. Such switching losses increase the need for component shielding due to EMI noise, and require greater heat protection due to increased power consumption. These undesirable effects of switching losses increase costs and reduce efficiency, thus reducing the acceptance of such conventional inverter techniques to industries. A resonant inverter circuit which achieves lossless, or zero voltage switching (soft switching) is therefore needed for efficiency reasons.

Soft switching snubber inverters of the present type normally use the resonant technique to reduce or eliminate the switching loss so that the frequency can be increased. High frequency soft switching improves inverter performance by elimination of acoustic noises and electromagnetic interferences, reduction of torque ripple, and improvement of efficiency. However, the resonant circuit generally produces either over-voltage or over-current conditions during switching. A typical resonant dc link inverter driving a three-phase ac motor can experience a peak dc bus voltage of twice the supply voltage in motoring mode operation, and the overshoot voltage can be more than three times the supply voltage in the regenerative mode. These inverters are also restricted to switching only at the zero voltage crossing to avoid short circuit destruction so that if zero voltage is never actually achieved then the device cannot switch. Other resonant inverters, such as a typical clamped mode resonant pole inverter, can experience overshoot current of more than twice the rated load current.

Figure 1:
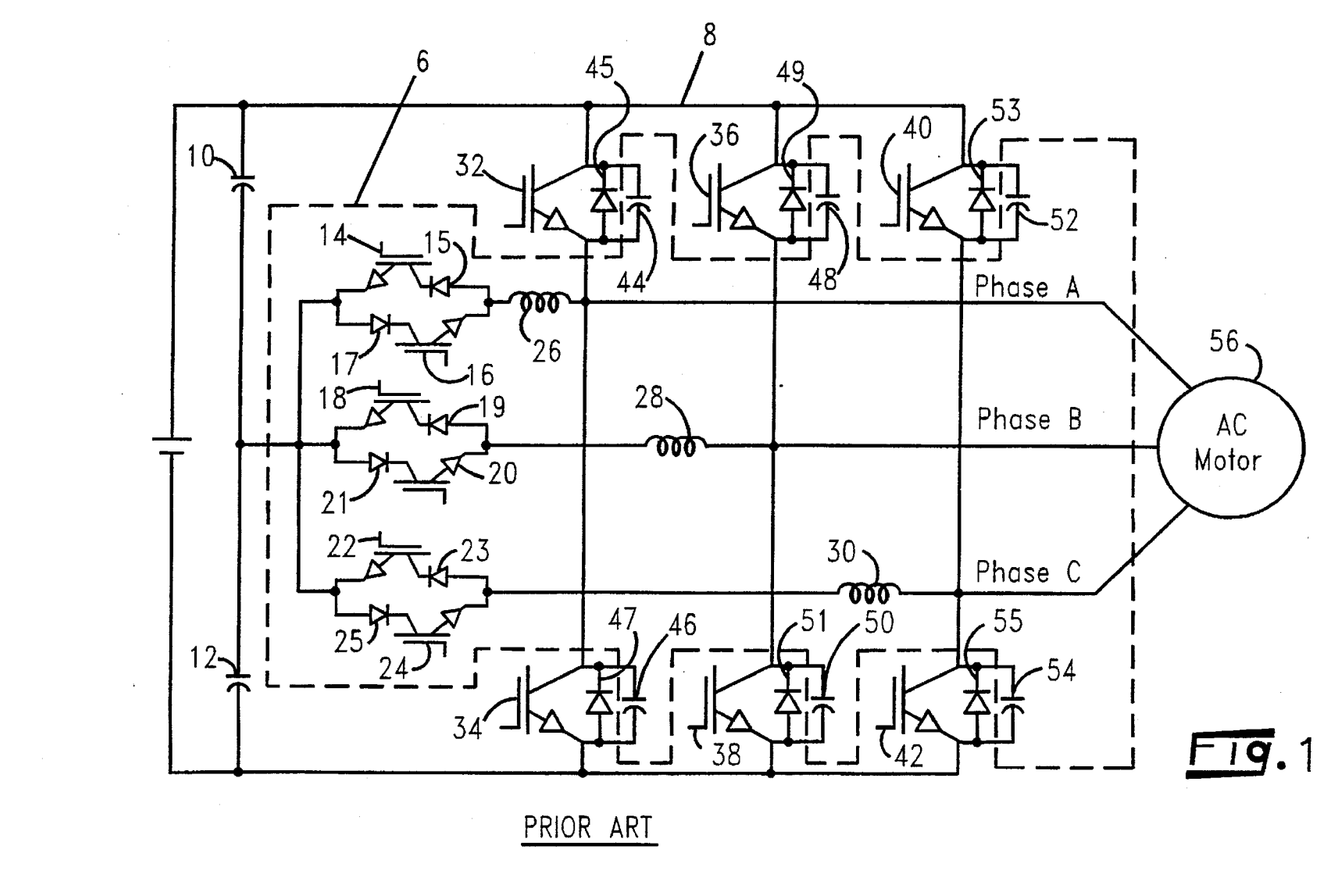
FIG. 1 is a prior art circuit diagram of a three-phase resonant snubber inverter using bi-directional switching in the snubber branches.

A resonant snubber inverter circuit currently exists which reduces over-voltage and over-current problems in the circuit. FIG. 1 shows such a three-phase resonant snubber circuit 6 which reduces over-voltage and over-current problems in resonant inverter circuits 8 without requiring that switching only occur at the zero voltage crossing. For each phase, this resonant snubber circuit 6 utilizes two anti-parallel auxiliary switches 14 & 16, 18 & 20, and 22 & 24 to control the resonance for the phase with each auxiliary switch pair being connected to the center tap of two energy storage capacitors 10 and 12 to provide the snubber voltage, a blocking diode 15, 17, 19, 21, 23, and 25 connected in series with each auxiliary switch, two high frequency resonant capacitors 44 & 46, 48 & 50, and 52 & 54, and a resonant inductor 26, 28, and 30. The main switches 32, 34, 36, 38, 40, and 42 control the current flowing to the motor 56. The six auxiliary switches 14–24, in series with their respective reverse blocking diodes 15–25, control snubbing during commutation of the main switches 32–42.

During commutation, resonant snubber inverters of the present type provide soft turn-on of the main switches without means external to the circuit. Without resonant snubbers, when turning on the main switches 32–42, the energy stored in the resonant capacitors 44–54 charges back to the main switches 32–42, and the reverse recovery current caused by the free-wheeling diodes 45–55 adds in, resulting in a large spiky current. The resonant snubber circuit 6 in FIG. 1 solves the turn-on over-current problem. For example, when the motor phase A current is positive and is flowing through the free-wheeling diode 47 which is anti-paralleled against main switch 34, before turning on main switch 32 when main switch 34 is still on, auxiliary switch 16 is turned on and a current flows through the resonant inductor 26 and main switch 34. When this current exceeds the load current, a resonance occurs between the resonant inductor 26 and the resonant capacitors 44 and 46. The resonant current diverts the current from the diode 47 against switch 34 to the diode 45 against switch 32, resulting in zero voltage across main switch 32. Zero voltage switching can then be achieved.

Although the FIG. 1 resonant snubber inverter allows the main switches to turn on at zero voltage across the main devices, the quantity of components required for this circuit makes its application less desirable.

SUMMARY OF THE INVENTION

To achieve efficient lossless switching of resonant snubber inverters there is needed a circuit composed of a minimal number of components which will enable the main devices to switch at zero voltage. The present invention provides a solution by utilizing a single auxiliary switch in the resonant snubber branches. Concerted operation of the snubber branches and the main switches enables the use of a single auxiliary switch, thereby reducing component count and improving efficiency.

The present invention may be used in various circuit topologies depending on the application. In one embodiment, an auxiliary resonant snubber circuit is connected to a main inverter circuit for soft switching of main inverter circuit switches. The auxiliary resonant snubber circuit comprises one or more snubber branches connected to the main circuit wherein each snubber branch comprises an inductor connected in series with a semiconductor switch. In another embodiment, a snubber-based, multi-phase inverter includes a main inverter circuit having a plurality of main switches and a source of capacitance connected to each of these main switches, an auxiliary resonant snubber circuit connected to the source of capacitance and having a plurality of resonant snubber branches with each branch comprising an auxiliary switch and inductor, and a means for controlling the main and auxiliary switches to achieve lossless switching during power conversion. The switch control means can be by any effective method of transistor gate control, including pulse-width modulation techniques.

Soft switching (snubbing) is achieved by producing zero voltage across the main switches. This is accomplished by using the resonant path through the auxiliary switches, a resonant inductor, and the stray capacitance of the main switches. The values of these parameters are selected to provide zero voltage across the main switch during resonance. By using resonance to establish zero voltage across the main switch, switching can occur at a lossless condition. The circuit design reduces component count by using a single switch per phase in the resonant snubber branches, by using the main switches to provide current to the snubber branches, and by fully utilizing the main switches and their stray capacitance in the circuit to achieve zero voltage switching. Current flows through the main switch to the snubber branch, thereby enabling resonance to occur so that zero voltage turn-on of another main switch can be achieved.

For single-phase applications, the resonant snubber inverter circuit is configured to consist of a main inverter circuit having a plurality of main switches and a source of capacitance, an auxiliary resonant snubber circuit connected to the source of capacitance and having two resonant snubber branches with each branch comprising an auxiliary switch and an inductor, and means for controlling the main and auxiliary switches. Similar to the three-phase switching methodology, lossless switching is accomplished by using resonance to establish zero voltage across the main switches.

A method for achieving lossless resonant snubbing during switching of main inverter circuit switches is disclosed. This method starts after the first upper and second lower main inverter switches have been turned off, forcing the first lower and second upper switches to conduct regeneratively through their antiparallel diodes. This method comprises the steps of turning on a first lower main inverter switch and a second upper main inverter switch so that the switches conduct, turning on a predetermined auxiliary switch located within a resonant snubber branch so that increasing current flows in the resonant snubber branch, turning off the first lower and second upper main switches to produce zero voltage across each by resonant discharge of their parallel capacitances, and turning on the first upper and second lower main switches at the resulting zero voltage condition.

Other embodiments of the invention include use in an uninterruptible power system to provide single-phase or multi-phase backup power, and use as a power line conditioner to compensate for harmonic currents and reactive power.

BRIEF DESCRIPTION OF THE DRAWINGS

Relative to the drawings wherein like reference characters designate like or similar elements throughout the several drawing figures.

DETAILED DESCRIPTION OF THE PREFERRED EMBODIMENT

Figure 2:
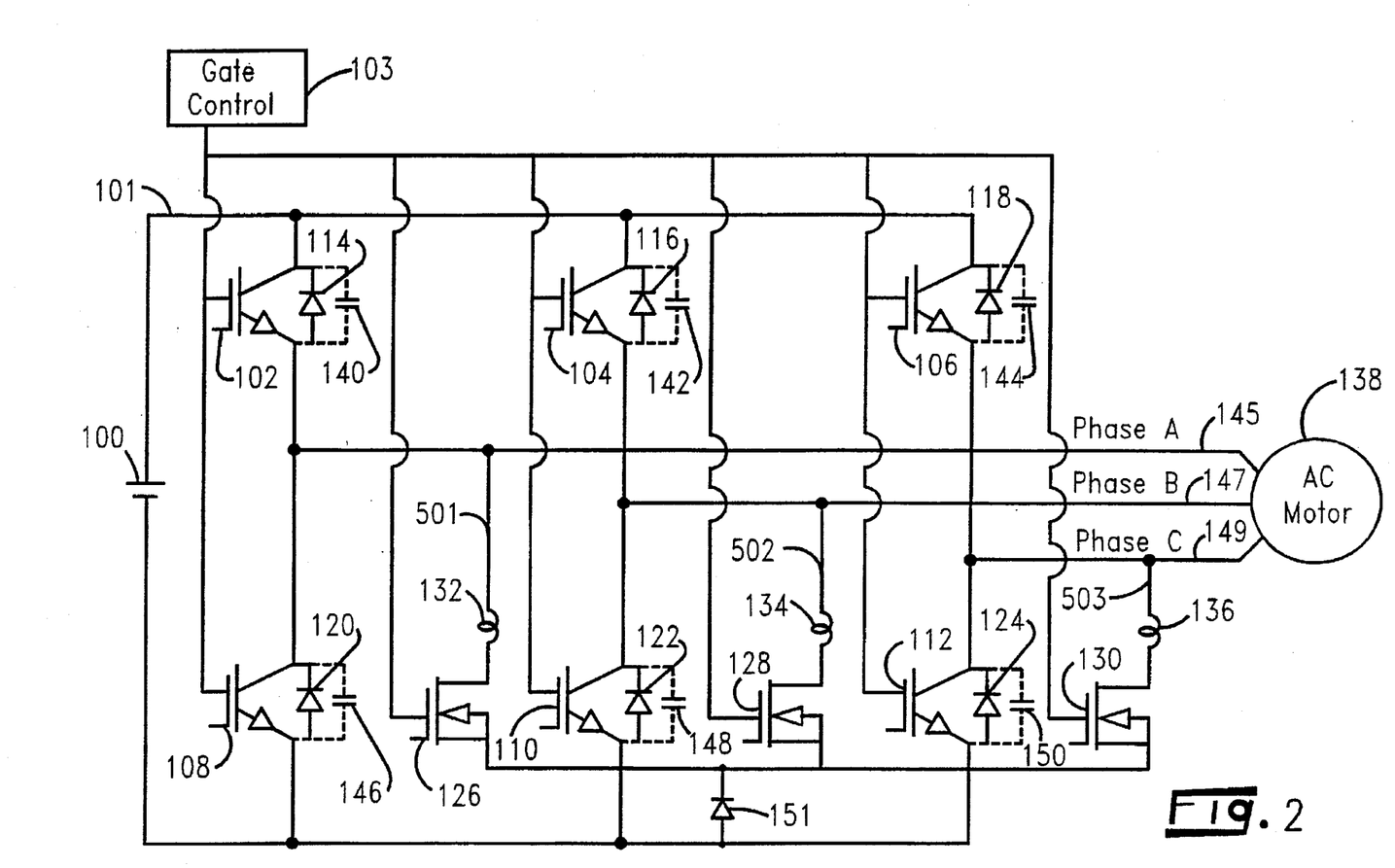
FIG. 2 is a circuit diagram of the three-phase, resonant snubber inverter using insulated gate bipolar transistors as the main switches and power MOSFET devices as the auxiliary switches.
Figure 3:
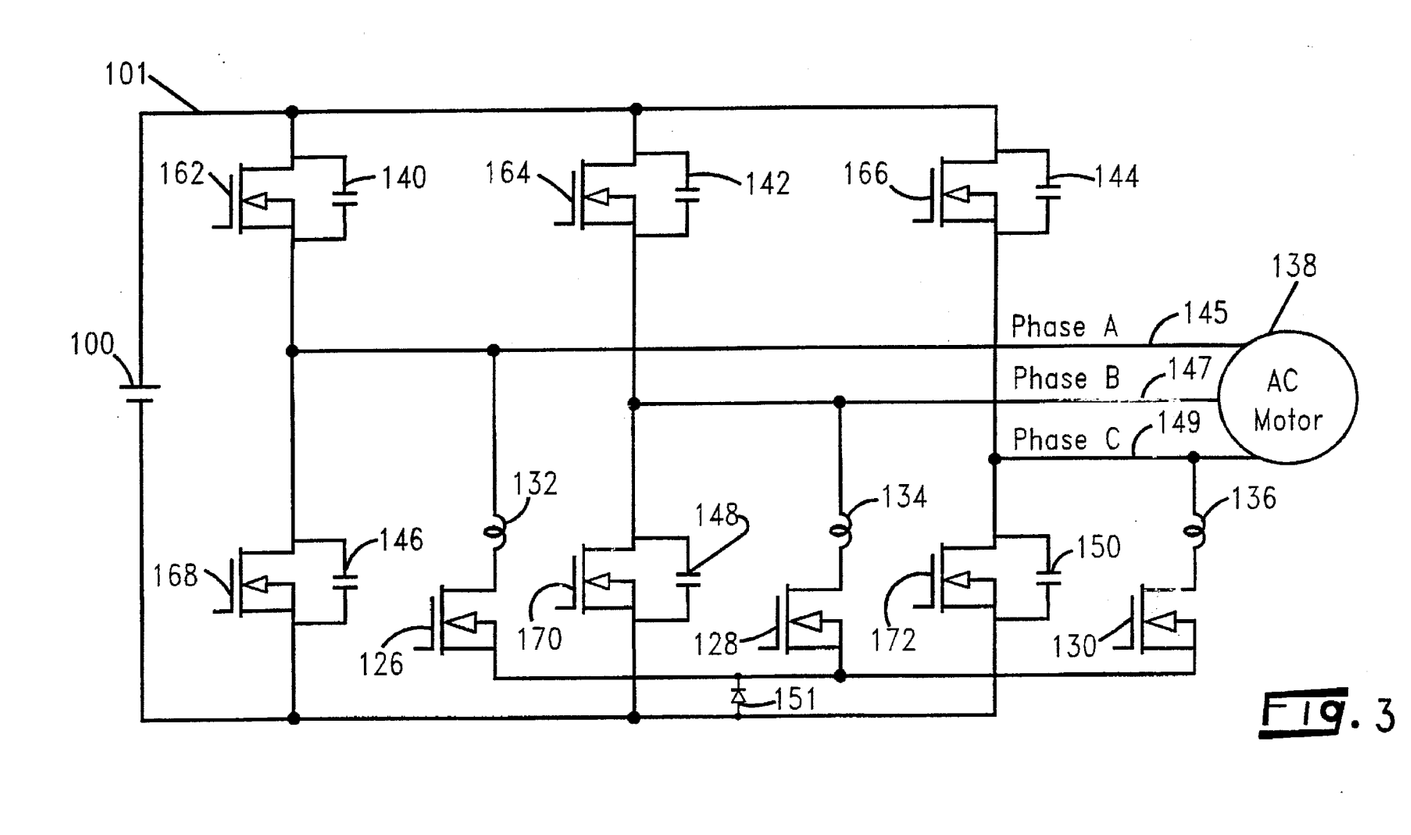
FIG. 3 is a circuit diagram of the three-phase, resonant snubber inverter using power MOSFET devices as the main switches and as the auxiliary switches.

Preferred embodiments of the present invention are shown in FIGS. 2 & 3. These embodiments differ only by the type of main switch that each employs. The embodiment of FIG. 2 shows a three-phase resonant, snubber-based, soft switching inverter circuit 101 which includes a dc voltage source 100, six main switches 102, 104, 106, 108, 110, and 112, six reverse blocking diodes 114, 116, 118, 120, 122, and 124 anti-paralleled with the main switches, three auxiliary switches 126, 128, and 130, three resonant inductors 132, 134, and 136, gate control logic 103 for switching the main switches 102–112 and auxiliary switches 126–130, a protective diode 151, and a three-phase ac motor 138. Gate control circuitry 103 shown in FIG. 2 is not illustrated in FIG. 3 and subsequent Figures for purposes of clarity. In the preferred embodiments, the main switches 102–112 in FIG. 2 are insulated gate bipolar transistors, and the main switches 162–172 in FIG. 3 are power MOSFET devices. In FIG. 2, each of the six main switches 102–112 is antiparalleled with a reverse blocking diode 114–124. The power MOSFET devices shown in FIG. 3 have inherent diode characteristics which eliminates the need for antiparallel diodes. Capacitors 140, 142, 144, 146, 148, and 150 ideally represent the stray capacitances of the main switches 102–112. These capacitors can also represent real capacitances as needed to compensate for variations in component tolerances. Although not intended as a limitation on possible equivalents of other embodiments, gate control 103 is preferably implemented by utilizing gate drivers and pulse width modulation control techniques.

With continued reference to FIG. 2, the phase A motor lead 145 is connected to the source of main switch 102, the drain of main switch 108, and inductor 132. The phase B motor lead 147 is connected to the source of main switch 104, the drain of main switch 110, and inductor 134. The phase C motor lead 149 is connected to the source of main switch 106, the drain of main switch 112, and inductor 136. Inductor 132 is connected in series with auxiliary switch 126. Inductor 134 is connected in series with auxiliary switch 128. Inductor 136 is connected in series with auxiliary switch 130. The sources of all three auxiliary switches 126, 128, and 130 are connected together. The cathode of protective diode 151 is connected to the sources of all three auxiliary switches 126–130 and the anode of protective diode 151 is connected to the sources of all three lower main switches 108, 110, & 112. This diode 151 reduces voltage spikes which would otherwise occur between upper switch 102–106 and lower switch 108–112 turn-off and turn-on.

A resonant path is established for each phase by use of a resonant inductor/auxiliary switch pair 132 & 126, 134 & 128, and 136 & 130. Each resonant inductor/auxiliary switch pair comprises a snubber branch so that a single snubber branch exists for each current phase, where snubber branch 501 consists of inductor 132 and auxiliary switch 126, snubber branch 502 consists of inductor 134 and auxiliary switch 128, and snubber branch 503 consists of inductor 136 and auxiliary switch 130. Each auxiliary switch is, for example, a power MOSFET device. The power MOSFET switches have inherent diode characteristics to allow current flow in two directions, thereby eliminating the need for antiparallel diodes.

With continued reference to FIG. 2, in operation, each of the three snubber branches 501, 502 and 503 acts to produce zero voltage across the main switches 102–112 during switching by establishing resonance across the main switches 102–112. This enables zero voltage, lossless switching. Each of the snubber branches 501, 502 and 503 operates in conjunction with the main switches to enable resonance to occur. In other words, each snubber branch 501, 502, and 503 depends on the main switches to supply the current needed to establish resonance. For example, when the phase-A current is flowing through diodes 116 and 120 which are antiparalleled against the second upper main switch 104 and the first lower main switch 108 respectively, zero voltage turn-on for first upper main switch 102 and second lower main switch 110 is achieved by turning on auxiliary switch 128 which creates a current path through main switch 104, inductor 134, auxiliary switch 128, auxiliary switch 126, inductor 132, and main switch 108. The supply voltage 100 is now fully charging through this current path, and the current through inductor 134 is linearly increased. When the inductor current is larger than the load current, a resonance occurs that discharges stray capacitors 140 & 148 and charges stray capacitors 142 & 146. When the voltage across stray capacitors 140 and 148 discharges resonantly to zero, main switches 102 and 110 are then switched at zero voltage condition. The same procedure is also used for the other switches.

The topology of the present invention fully utilizes the main switches and their stray capacitances to achieve zero voltage switching. The stray capacitance, which traditionally introduces large amounts of turn-on current to the device, is now used as the resonant capacitor. As a result, the number of circuit components in this topology is reduced over the prior art while the zero voltage switching property is maintained. However, variations in component values may require the use of real capacitors in order to achieve a sharper zero voltage switching condition. Thus, in an alternate embodiment using real components, capacitors 140–150 represent stray capacitances plus real capacitances. Although the three auxiliary switches 126–130 are needed to produce the resonant paths, their size can be much smaller than the main switches because their duty cycle is very small, typically less than five percent.

Figure 4:
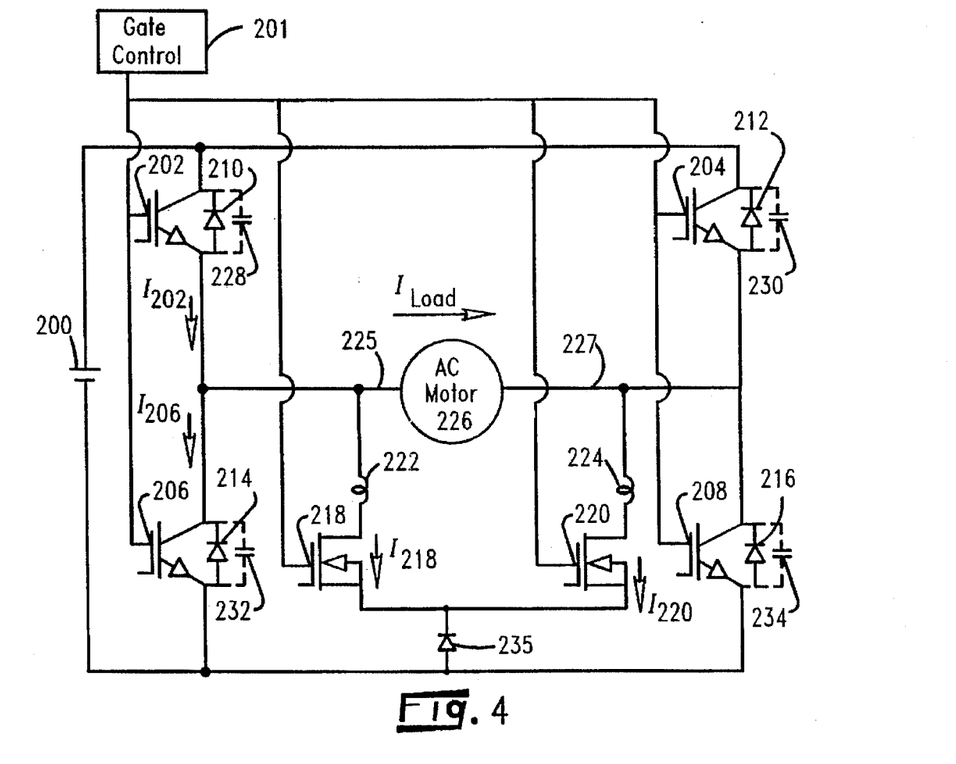
FIG. 4 is a circuit diagram of the single-phase, resonant snubber inverter using insulated gate bipolar transistors as the main switches and power MOSFET devices as auxiliary switches.

There is shown in FIG. 4 a single-phase embodiment of the invention. This circuit configuration consists of a dc power source 200, four main switches 202, 204, 206, and 208, four reverse blocking diodes 210, 212, 214, and 216, two auxiliary switches 218 and 220, two resonant inductors 222 and 224, gate control logic 201 for switching the main switches 202–208 and auxiliary switches 218 and 220, a protective diode 235, and a single-phase motor 226. Insulated gate bipolar transistors, for example, are used for each of the four main switches 202–208, and each main switch 202–208 is antiparalleled with a reverse blocking diode 210–216. Capacitors 228, 230, 232, and 234 represent the stray capacitances of the main switches 202–208. Variations in component tolerances may require the addition of real capacitors in parallel with the stray capacitances. Thus, in an alternate embodiment using real components, capacitors 228–234 represent stray capacitances plus real capacitors.

Figure 5:
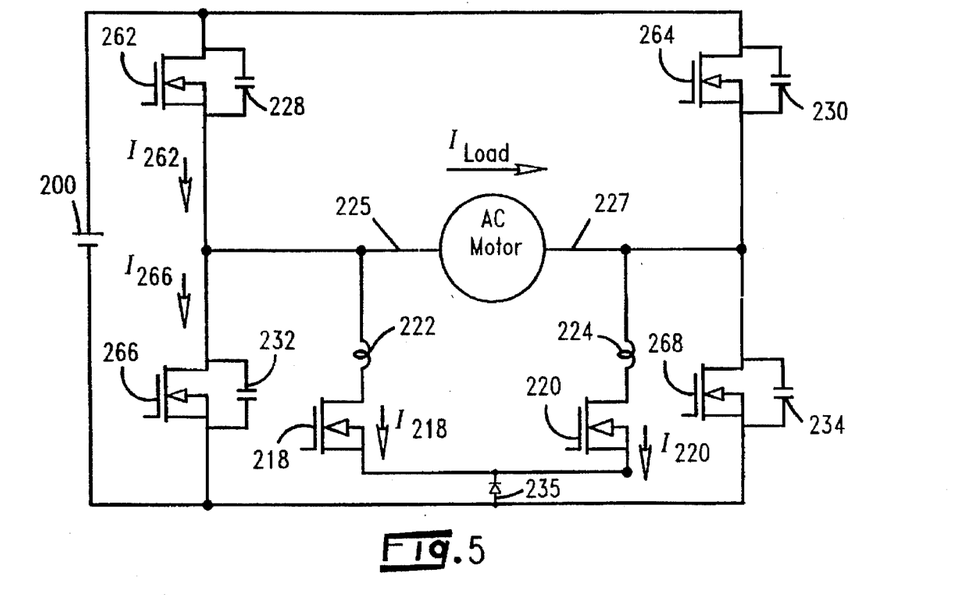
FIG. 5 is a circuit diagram of the single-phase, resonant snubber inverter using power MOSFET devices as the main switches and as the auxiliary switches.

FIG. 5 shows a single-phase embodiment of the present invention with power MOSFET devices used as the main switches 262–268. The power MOSFET devices have inherent diode characteristics and eliminate the need for antiparallel diodes.

The resonant snubber circuit of the single-phase embodiment shown in FIG. 4 is comprised of the two resonant inductors 222 and 224, the two auxiliary switches 218 and 220, and resonant capacitors 228–234. Each auxiliary switch is, for example, a power MOSFET device. One motor lead 225 is connected to the source of main switch 202, the drain of main switch 206, and one side of inductor 222. The other motor lead 227 is connected to the source of main switch 204, the drain of main switch 208, and one side of inductor 224. The other side of inductor 222 is connected to the drain of auxiliary switch 218. The other side of inductor 224 is connected to auxiliary switch 220. The sources of auxiliary switches 218 and 220 are connected to each other. One terminal of the dc power source 200 is connected to the drains of main switches 202 and 204. The other terminal of the power source 200 is connected to the sources of main switches 206 and 208. The cathode of protective diode 235 is connected to the sources of auxiliary switches 218 and 220 and the anode of protective diode 235 is connected to the sources of main switches 206 and 208.

Lossless switching of the main switches 202–208 is achieved by creating zero voltage across the resonant capacitors 228–234, which in turn requires activation of auxiliary switches 218 and 220. To activate these auxiliary switches, a gate voltage is applied for a very short duration; for example—three microseconds. For a 60 hertz circuit output, one cycle equals 16.7 milliseconds; therefore, a three microsecond pulse is of relatively short duration. During this three microsecond transition cycle, current is built up linearly through the auxiliary switch 218 or 220 to twice the load current, resonance occurs, and the main switch 202–208 is switched at zero voltage. The sequence of events can be best illustrated by reference to the current flow arrows $I_{202}$ and $I_{206}$ shown in FIG. 3. These arrows indicate nominal current directions. For an initially positive load current, the operating modes for turning on main switch 202 at zero voltage condition are illustrated in FIGS. 6–11. These figures progressively illustrate the sequence of events for turning on main switch 202 in FIG. 3. FIG. 12 shows the corresponding waveforms for the different operating modes of FIGS. 4–9, where $t_1$–$t_6$ represents a three microsecond transition cycle and where:

$I_{220}$=current through auxiliary switch 220

$I_{load}$=current through the load 226

$I_{202}$=current through main switch 202

$I_{206}$=current through main switch 206

$I_{228}$=current through resonant capacitor 228

$I_{232}$=current through resonant capacitor 232

$Vg_{206}$=pulse width modulated gate voltage of main switch 206

$Vg_{202}$=pulse width modulated gate voltage of main switch 202

$Vg_{220}$=gate voltage of auxiliary switch 220

$VDS_{202/208}$=drain to source voltage for main switches 202 and 208. All unmarked arrows shown in FIGS. 6–11 indicate normal current flows during the represented time frames.

Figure 6:
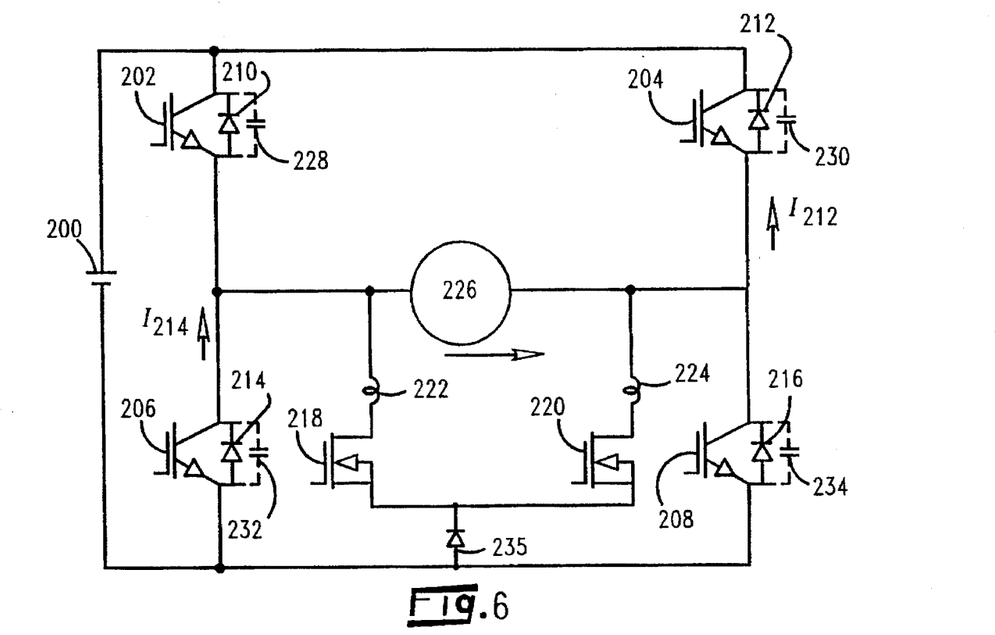
FIG. 6 is an illustration of the operating mode of the single-phase inverter during time $t_0$–$t_1$.

With continued reference to FIGS. 6–12, the different operating modes for a transition cycle ($t_1$–$t_6$) that turns on and off the auxiliary switch 220 and turns on main switch 202 can be described. FIG. 6 shows the initial condition whereby a positive load current $I_{212}$ and $I_{214}$ is freewheeling through diodes 212 and 214 with main switches 204 and 206 remaining on.

Figure 7:
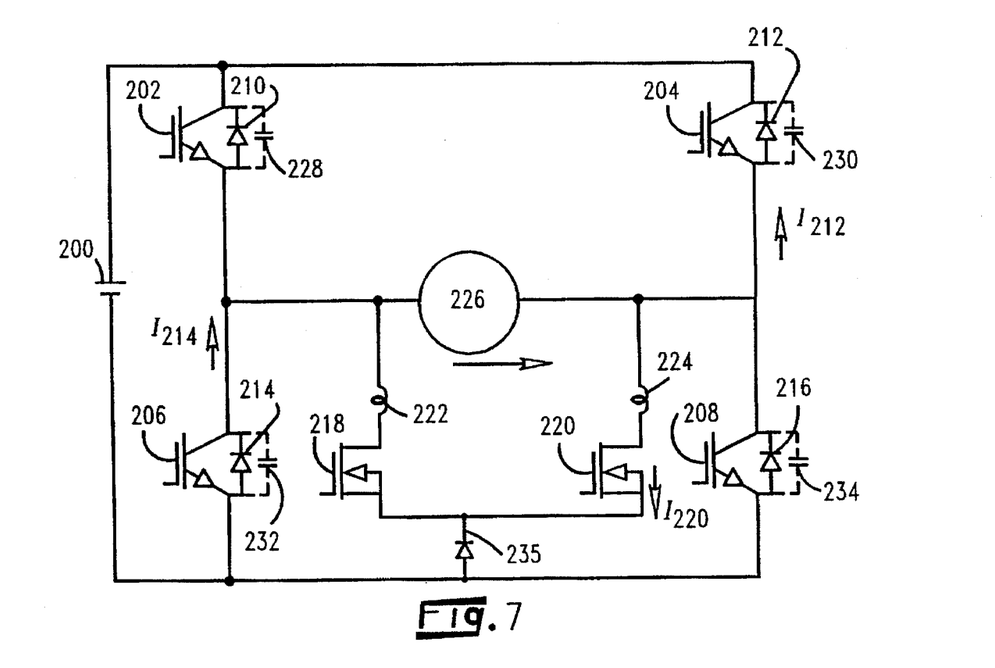
FIG. 7 is an illustration of the operating mode of the single-phase inverter during time $t_1$–$t_2$.

In FIG. 7, at time $t_1$, auxiliary switch 220 is turned on. The resonant inductor 224 current is built up linearly. The current $I_{212}$ and $I_{214}$ in main switches 204 and 206 gradually reduces to zero at time $t_2$ when the resonant inductor 224 current $I_{220}$ equals the load 226 current.

Figure 8:
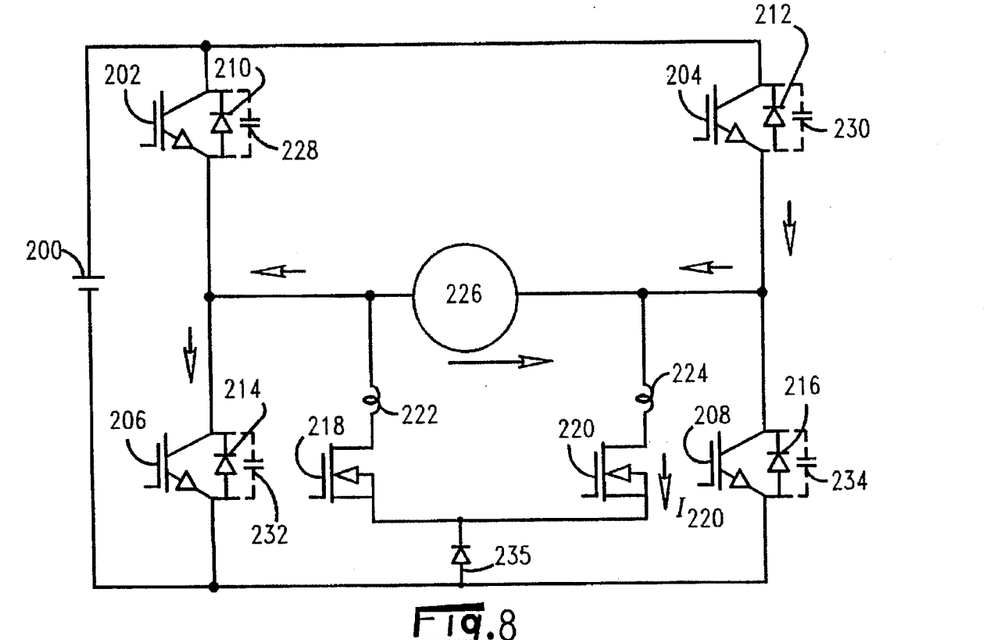
FIG. 8 is an illustration of the operating mode of the single-phase inverter during time $t_2$–$t_3$.

In FIG. 8, the inductor 224 current $I_{220}$ exceeds the load 226 current at $t_2$. When the resonant current $I_{220}$ reaches twice the load 226 current at $t_3$, main switches 204 and 206 turn off. Capacitors 230 and 232 serve as lossless snubbers to allow zero voltage turn-off.

Figure 9:
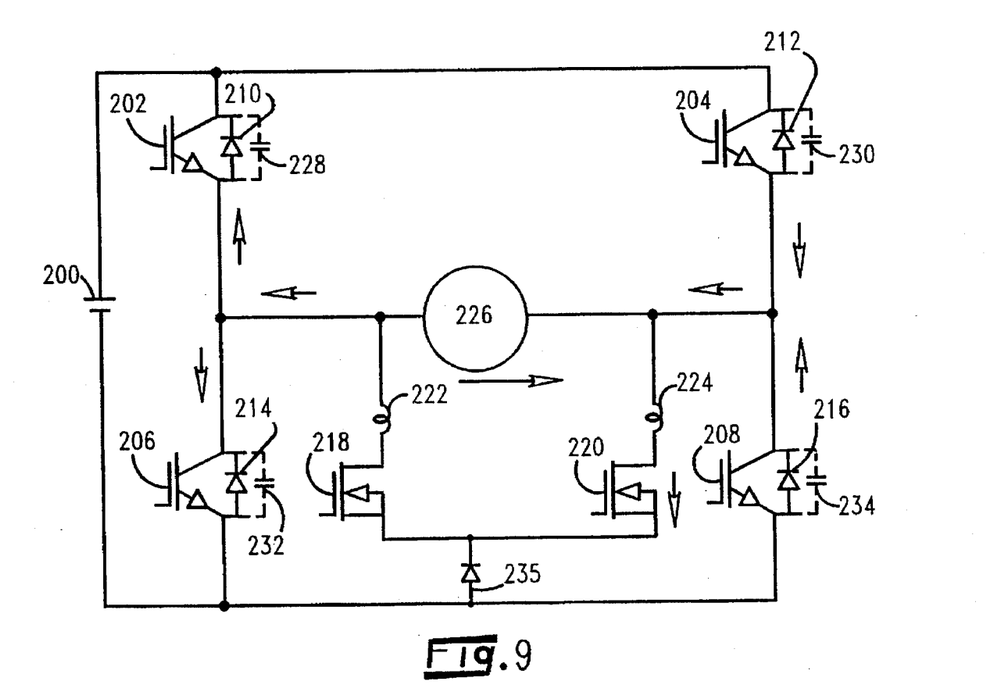
FIG. 9 is an illustration of the operating mode of the single-phase inverter during time $t_3$–$t_4$.

In FIG. 9, the resonant capacitors 228 and 234 conduct at time $t_3$. Capacitors 230 and 232 are charged to full voltage, and capacitors 228 and 234 are discharged to zero voltage at $t_4$.

Figure 10:
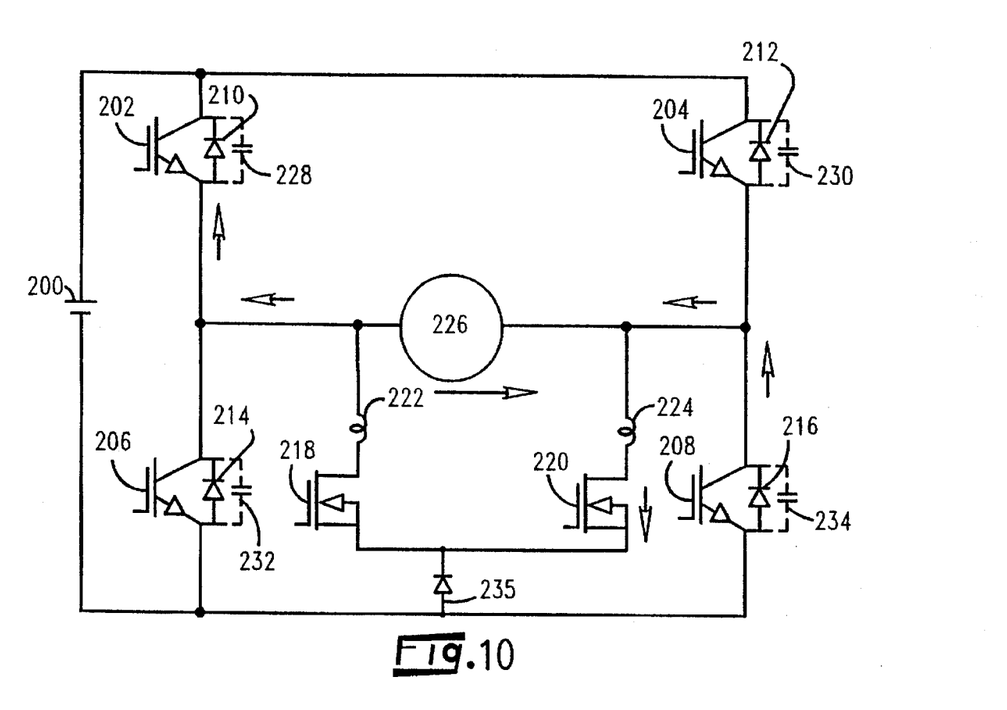
FIG. 10 is an illustration of the operating mode of the single-phase inverter during time $t_4$–$t_5$.

In FIG. 10, the resonant current $I_{220}$ starts decreasing, and the load 226 current is diverted to diodes 210 and 216. Main switches 202 and 208 are turned on at zero voltage condition. At time $t_5$, the resonant current $I_{220}$ through inductor 224 equals the load 226 current, and the diode currents are diverted to main switches 202 and 208.

Figure 11:
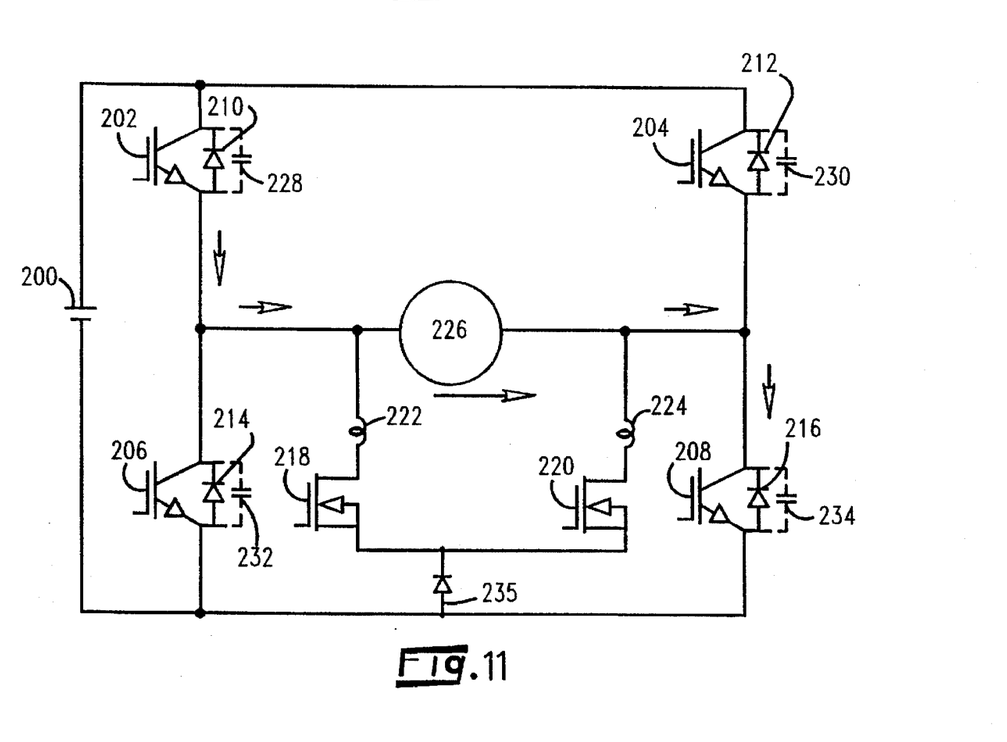
FIG. 11 is an illustration of the operating mode of the single-phase inverter during time $t_5$–$t_6$.
Figure 12:
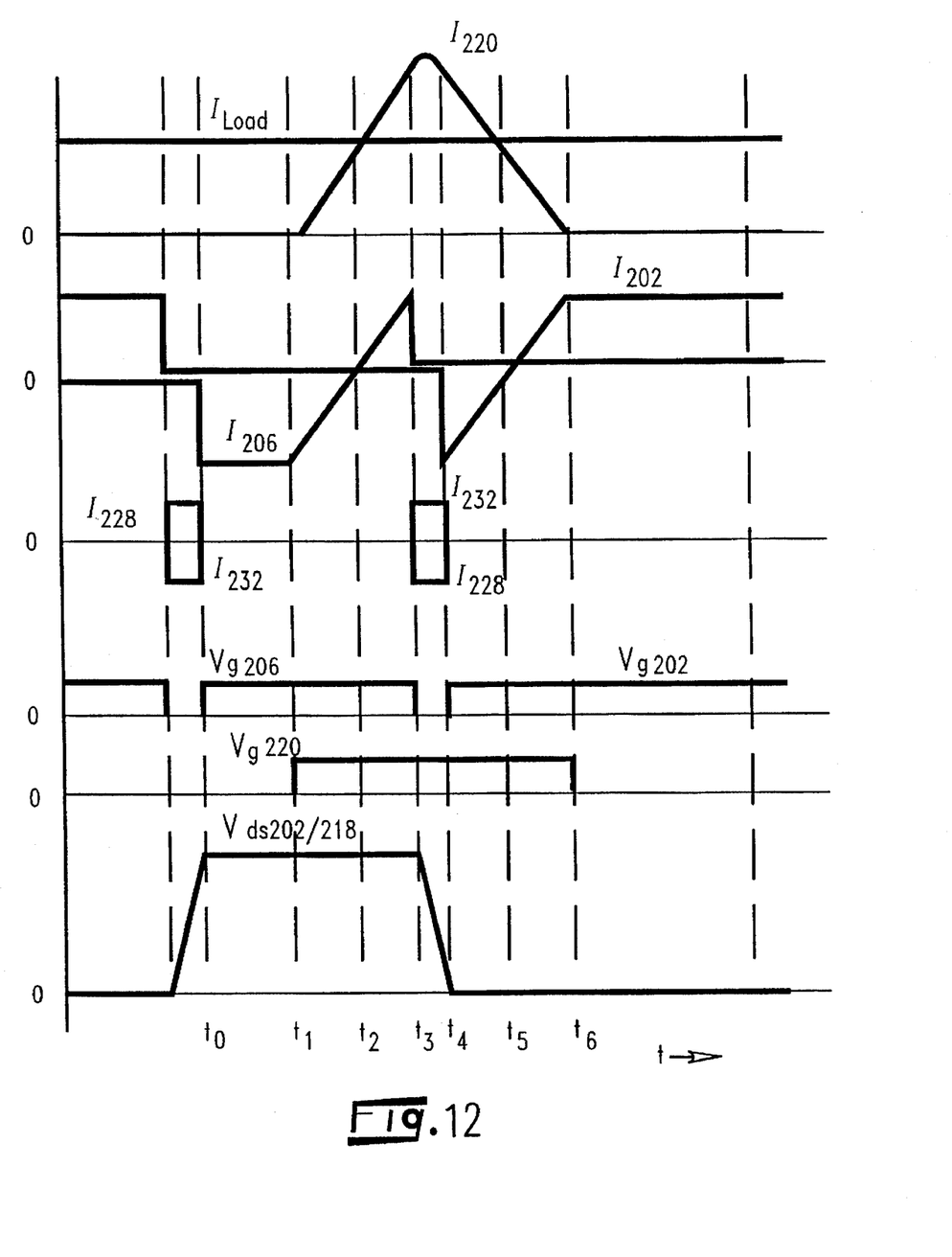
FIG. 12 is a timing chart showing the corresponding waveforms for the different operating modes illustrated in FIGS. 6–11.

In FIG. 11, the resonant current through inductor 224 keeps decreasing, and the main switch current is increased linearly. At time $t_6$, the resonant current $I_{220}$ drops to zero, and the auxiliary switch 220 is turned off at zero current condition.

The switching methodology for a three-phase embodiment is similar to the single-phase embodiment of the invention in that switching of the main switches can occur within a three microsecond transition cycle.

This resonant soft switching inverter circuitry uses fewer components in the auxiliary snubber branches of the circuit than other resonant soft switching inverters. Reduced component count translates to reduced costs which makes application of this invention highly desirable. Single-phase and three-phase dc-to-ac power conversion embodiments of the invention do not constitute an exhaustive list. It is contemplated that the invention may be embodied in any application which may utilize resonant soft switching.

Figure 13:
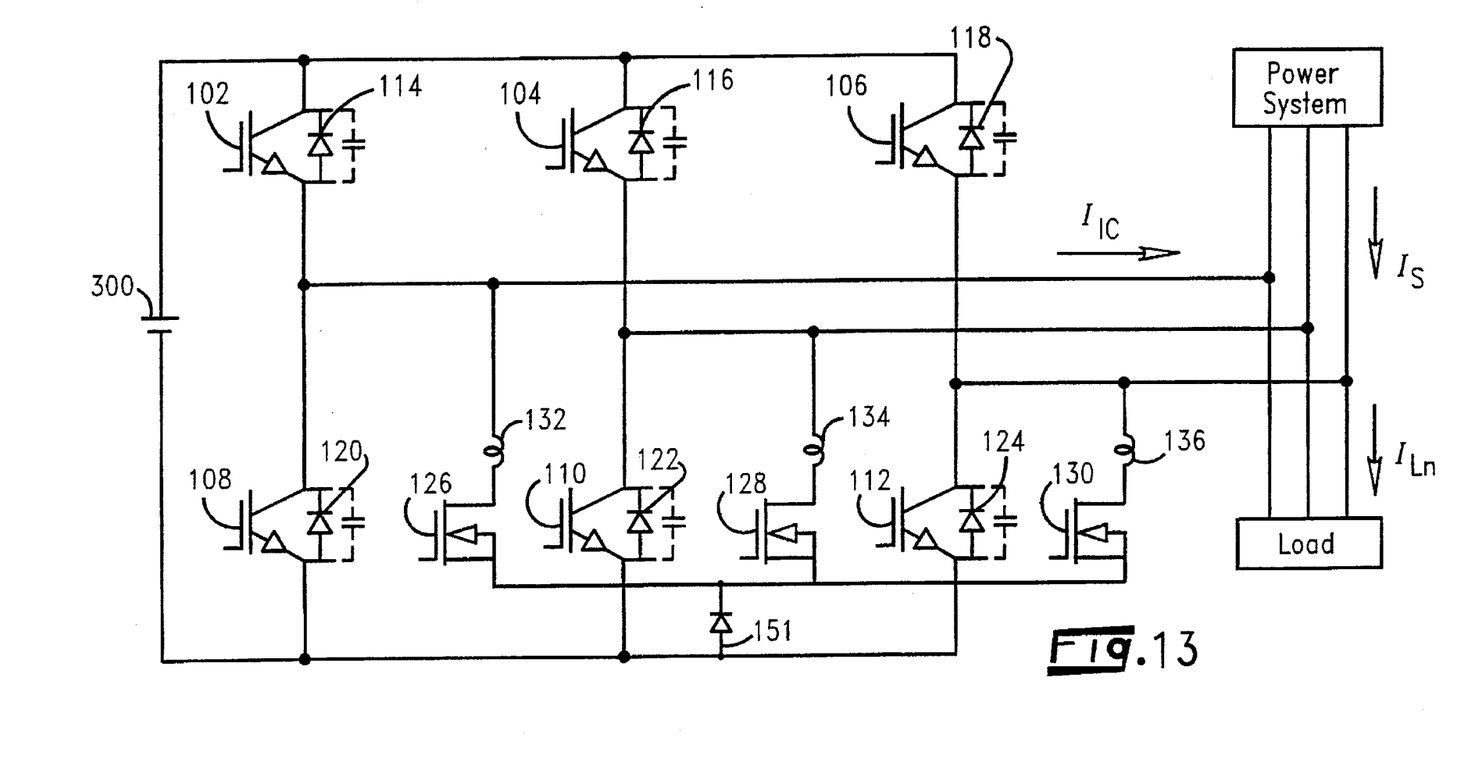
FIG. 13 is a circuit diagram of the three-phase resonant snubber inverter configured for active harmonic filtering and reactive power compensation applications.

FIG. 13 shows an application of the invention for three-phase active harmonic filtering and reactive power compensation. This topology is essentially the same as for the three-phase ac-to-dc converter application except the dc power source 100 of FIGS. 2 & 3 is replaced with a capacitor 300. When all switches are turned off, capacitor 300 gets charges from diodes 114–124.

With continued reference to FIG. 13, instead of drawing sinusoidal current $I_s$, ac loads can sometimes draw lagging or nonsinusoidal currents. For lagging current $I_{LN}$, reactive power compensation is required. For nonsinusoidal currents $I_{LN}$, harmonic filtering is required. The configuration of FIG. 13 performs both functions. To compensate for nonsinusoidal or lagging current $I_{LN}$ On phase A, main switch 102 is turned on to create positive injecting current shown by $I_{IC}$, and main switch 108 is turned on to create negative injecting current. This procedure is followed by the other two main switch pairs 104 & 110 and 106 & 112 as well to ensure the current on the power system side is always sinusoidal and in phase with the system voltage. The auxiliary switch and inductor pairs 132 & 126, 134 & 128, and 136 & 130 provide soft switching of the main switches 102–112 as previously discussed.

Figure 14:
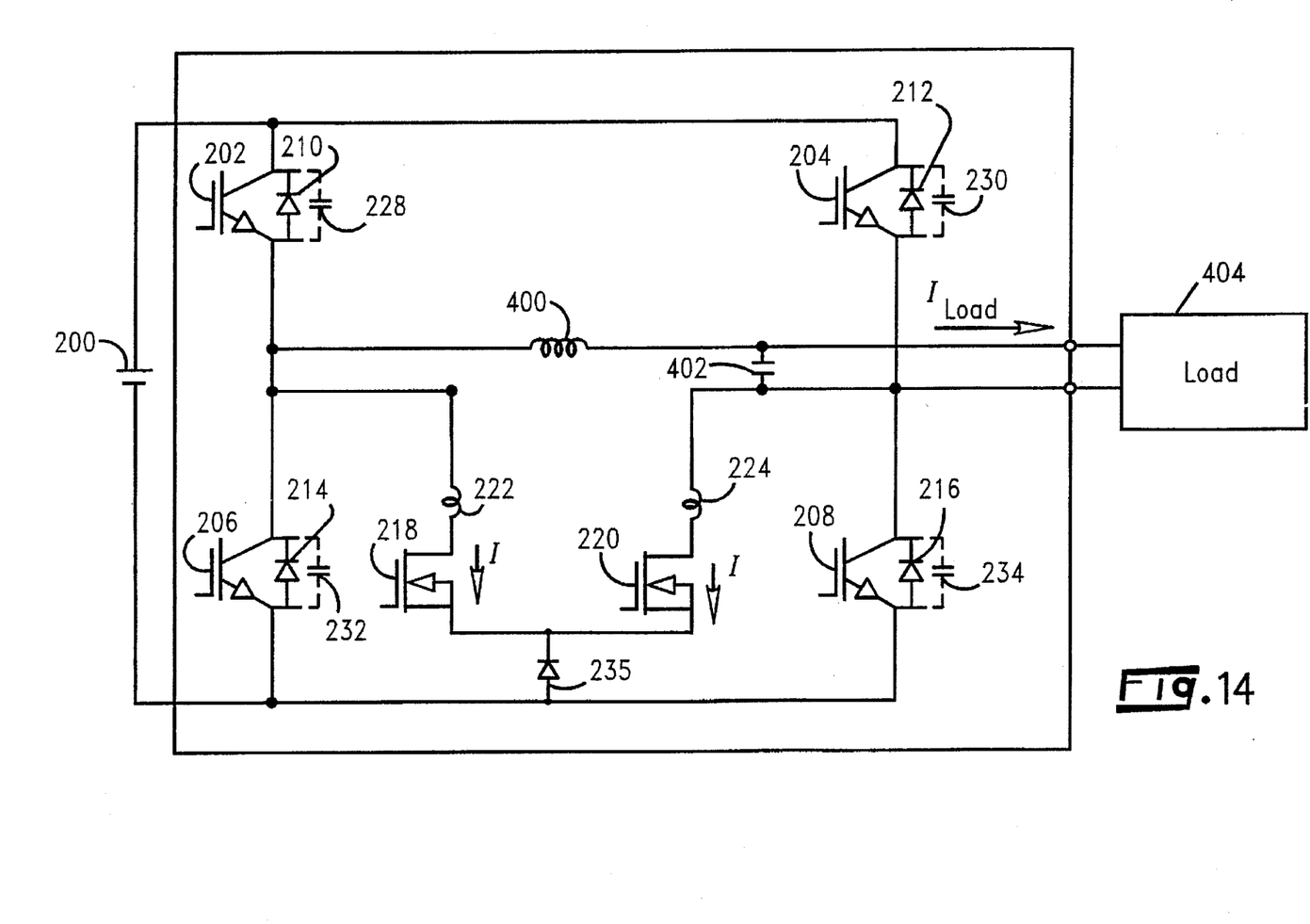
FIG. 14 is a circuit diagram of the single-phase resonant snubber inverter configured for uninterruptible power system applications.

FIG. 14 shows an application of the resonant snubber based inverter for an uninterruptible power system. This topology is essentially the same as for the single-phase dc-to-ac conversion shown in FIG. 4 except an inductor 400 and a capacitor 402 are added to obtain smooth output voltage. The load 404 can be any appliance or electronic equipment, such as a computer or copy machine. The present invention is an attractive feature in this application because the efficiency improvement extends the battery life of the equipment's run time after main power outage.

It is contemplated, and will be apparent to those skilled in the art from the preceding description and accompanying drawings that modifications and/or changes may be made in the illustrated embodiments of the invention. Accordingly, it is expressly intended that the foregoing description and accompanying drawings are illustrative of preferred embodiments only, not limiting thereto, and that the true spirit and scope of the present invention be determined by reference to the appended claims.

We claim:

1. An auxiliary resonant snubber circuit connected to a main inverter circuit having a main power source for soft switching of inverter circuit main switches, the snubber circuit comprising:

a plurality of snubber branches connected to said main circuit, wherein each snubber branch includes an inductor connected in series with only one semiconductor switch, for conducting current from said main power source through said plurality of snubber branches to produce resonant currents that result in zero voltage across predetermined main switches.

2. The snubber circuit as described in claim 1, further comprising sources of capacitance connected in parallel with each of said main switches, wherein said main switches conduct current from said main power source to said snubber branches for production of resonant currents, said resonant currents producing zero voltage across said main switches by repetitively charging and discharging said sources of capacitance to enable zero voltage turn-on of said inverter circuit main switches.

3. A method for achieving lossless resonant snubbing during switching of an inverter circuit having a first upper main switch and a first lower main switch connected in series, and a second upper main switch and a second lower main switch connected in series, each of the main switches having a parallel capacitance associated with the switch, comprising the steps of:

turning on the first lower main switch and second upper main switch so that the first lower and second upper main switches conduct current;

providing resonant snubber branches, one snubber branch being connected at junctions between each upper and lower main switches;

turning on a predetermined auxiliary switch located within a resonant snubber branch so that increasing current flows in said resonant snubber branch; turning off said first lower and second upper main switches, thereby initiating resonant discharge of capacitances located in parallel with the first upper main switch and the second lower main switch to produce zero voltage across said first upper and second lower main switches;

turning on said first upper and second lower main switches at said zero voltage condition.

4. A resonant, snubber-based, soft switching, multi-phase, inverter circuit for achieving lossless switching of circuit components, comprising:

a main inverter circuit having a plurality of main switches and sources of capacitance connected to said main switches, said main circuit producing a plurality of current phases;

an auxiliary resonant snubber circuit connected to said inverter circuit and having a plurality of resonant snubber branches for repetitively producing zero voltage across each of said main switches and sources of capacitance, each of said snubber branches comprising an inductor and an auxiliary switch connected in series with said inductor, each auxiliary switch having a source, gate, and drain;

a protective diode having an anode and a cathode, said cathode being connected to the sources of said auxiliary switches; and a controller for controlling said main and auxiliary switches to achieve lossless switching by switching said auxiliary switches to produce zero voltage conditions across said main switches and by switching on said main switches during said zero voltage conditions.

5. The inverter circuit as described in claim 4, wherein said sources of capacitance further comprises capacitance in parallel with each of said main switches, said capacitance being resonated by said snubber branches during turn-on of said main switches.

6. The inverter circuit as described in claim 4, said main inverter circuit further comprising for each current phase:

an upper semiconductor switch and a lower semiconductor switch, each having a source, gate, and drain;

means for connecting the source of the upper semiconductor switch to the drain of the lower semiconductor switch;

a reverse blocking diode antiparalleled against each of said semiconductor switches; and means for connecting the source of the lower semiconductor switch to the anode of said protective diode;

wherein the alternating current for each phase is produced at the source-drain junction of the two semiconductor switches for each phase.

7. A resonant, snubber-based, soft switching, single-phase, inverter circuit for achieving lossless switching of circuit components, comprising:

a main inverter circuit having a plurality of main switches and sources of capacitance connected to said main switches, said main circuit producing a single current phase;

an auxiliary resonant snubber circuit connected to said inverter circuit and having two resonant snubber branches for repetitively producing zero voltage across each of said main switches and sources of capacitance, each of said snubber branches comprising an inductor and only one auxiliary switch connected in series with said inductor, each auxiliary switch having a source, gate, and drain;

a protective diode having an anode and a cathode, said cathode being connected to the sources of said auxiliary switches; and a controller for controlling said main and auxiliary switches to achieve lossless switching by switching said auxiliary switches to produce zero voltage conditions across said main switches and by switching said main switches during said zero voltage conditions.

8. The inverter circuit as described in claim 7, wherein said sources of capacitance further comprise capacitance in parallel with each of said main switches, said capacitance being resonated by said snubber branches during turn-on of said main switches.

9. The inverter circuit as described in claim 7, said main circuit further comprising:

a first semiconductor switch having a source, gate and drain;

a first reverse blocking diode antiparalleled against said first semiconductor switch;

a second semiconductor switch having a source, gate and drain;

a second reverse blocking diode antiparalleled against said second semiconductor switch;

a third semiconductor switch having a source, gate and drain;

a third reverse blocking diode antiparalleled against said third semiconductor switch;

a fourth semiconductor switch having a source, gate and drain;

a fourth reverse blocking diode antiparalleled against said fourth semiconductor switch;

means for connecting the source of the first semiconductor switch to the drain of the second semiconductor switch, forming a first semiconductor switch pair;

means for connecting the source of the third semiconductor switch to the drain of the fourth semiconductor switch, forming a second semiconductor switch pair;

means for connecting the drains of the first and third semiconductor switches; and means for connecting the sources of the second and fourth semiconductor switches to the anode of said protective diode;

wherein the single-phase alternating current is produced at the source-drain junctions of the two semiconductor switch pairs.

10. A resonant snubber based soft switching inverter circuit for achieving lossless turn-on of circuit components during three-phase dc-to-ac power conversion, comprising:

a first semiconductor switch having a source, gate, and drain;

a first reverse blocking diode antiparalleled against said first semiconductor switch;

a first capacitance source in parallel with said first semiconductor switch;

a second semiconductor switch having a source, gate, and drain;

a second reverse blocking diode antiparalleled against said second semiconductor switch;

a second capacitance source in parallel with said second semiconductor switch;

means for connecting the source of the first semiconductor switch to the drain of the second semiconductor switch for conducting a first phase alternating current;

a third semiconductor switch having a source, gate, and drain;

a third reverse blocking diode antiparalleled against said third semiconductor switch;

a third capacitance source in parallel with said third semiconductor switch;

a fourth semiconductor switch having a source, gate, and drain;

a fourth reverse blocking diode antiparalleled against said fourth semiconductor switch;

a fourth capacitance source in parallel with said fourth semiconductor switch;

means for connecting the source of the third semiconductor switch to the drain of the fourth semiconductor switch for conducting a second phase alternating current;

a fifth semiconductor switch having a source, gate, and drain;

a fifth reverse blocking diode antiparalleled against said fifth semiconductor switch;

a fifth capacitance source in parallel with said fifth semiconductor switch;

a sixth semiconductor switch having a source, gate, and drain;

a sixth reverse blocking diode antiparalleled against said sixth semiconductor switch;

a sixth capacitance source in parallel with said sixth semiconductor switch;

means for connecting the source of the fifth semiconductor switch to the drain of the sixth semiconductor switch for conducting a third phase alternating current;

a protective diode having an anode and a cathode;

a dc voltage source having two terminals;

means for connecting one terminal of the dc voltage source to the drains of the first, third, and fifth semiconductor switches;

means for connecting the other terminal of the dc voltage source to the sources of said second, fourth, and sixth semiconductor switches and the anode of said protective diode;

first phase means for connecting said first phase alternating current to a load;

second phase means for connecting said second phase alternating current to the load;

third phase means for connecting said third phase alternating current to the load;

a first auxiliary semiconductor switch having a source, gate and drain;

a first inductor;

means for connecting the drain of said first auxiliary semiconductor switch in series with the first inductor;

a second auxiliary semiconductor switch having a source, gate and drain;

a second inductor;

means for connecting the drain of said second auxiliary semiconductor switch in series with the second inductor;

a third auxiliary semiconductor switch having a source, gate and drain;

a third inductor;

means for connecting the drain of said third auxiliary semiconductor switch in series with the third inductor;

means for connecting the first inductor to the first phase means;

means for connecting the second inductor to the second phase means;

means for connecting the third inductor to the third phase means;

means for connecting the sources of said first, second, and third auxiliary semiconductor switches to the cathode of said protective diode; and means for controlling the gates of all said semiconductor switches;

said semiconductor switches, diodes, and inductors having parameters selected so that resonance is established within each of said phases and across the stray capacitances of each semiconductor switch to produce zero voltage across said semiconductor switches during switching of said semiconductor switches.

11. A resonant snubber based soft switching inverter circuit for achieving lossless switching of circuit components during single-phase dc-to-ac power conversion, comprising:

a first semiconductor switch having a source, gate, and drain;

a first reverse blocking diode antiparalleled against said first semiconductor switch;

a first capacitance source in parallel with said first semiconductor switch;

a second semiconductor switch having a source, gate, and drain;

a second reverse blocking diode antiparalleled against said second semiconductor switch;

a second capacitance source in parallel with said second semiconductor switch;

means for connecting the source of the first semiconductor switch to the drain of the second semiconductor switch for conducting a first alternating current;

a third semiconductor switch having a source, gate, and drain;

a third reverse blocking diode antiparalleled against said third semiconductor switch;

a third capacitance source in parallel with said third semiconductor switch;

a fourth semiconductor switch having a source, gate, and drain;

a fourth reverse blocking diode antiparalleled against said fourth semiconductor switch;

a fourth capacitance source in parallel with said fourth semiconductor switch;

means for connecting the source of the third semiconductor switch to the drain of the fourth semiconductor switch for conducting a second alternating current;

a protective diode having an anode and a cathode;

a dc voltage source having two terminals;

means for connecting one terminal of the dc voltage source to the drains of the first and third semiconductor switches;

means for connecting the other terminal of the dc voltage source to the sources of the second and fourth semiconductor switches and the anode of said protective diode;

means for connecting the first alternating current to a load;

means for connecting the second alternating current to said load;

a first auxiliary semiconductor switch having a source, gate and drain;

a first inductor;

means for connecting the drain of said first auxiliary semiconductor switch in series with the first inductor;

a second auxiliary semiconductor switch having a source, gate and drain;

a second inductor;

means for connecting the drain of said second auxiliary semiconductor switch in series with the second inductor;

means for connecting the first inductor to the first alternating current;

means for connecting the second inductor to the second alternating current;

means for connecting the sources of the first and second auxiliary semiconductor switches to the cathode of said protective diode; and means for controlling the gates of all said semiconductor switches;

said semiconductor switches, diodes, and inductors having parameters selected so that resonance is established across the stray capacitances of each semiconductor switch to produce zero voltage across said semiconductor switches during switching of said semiconductor switches.

12. An auxiliary resonant snubber circuit connected to a main inverter circuit for soft switching of inverter circuit main switches during dc-to-ac conversion of power from a dc power source, the snubber circuit comprising:

a plurality of snubber branches connected to said main circuit for selectively conducting current from the dc power source through one or more snubber branches to produce resonant currents that result in zero voltage conditions across predetermined main switches;

wherein each of said plurality of snubber branches includes only an inductor connected in series with a semiconductor switch.

* * * * *